United States Patent
Sewell et al.

(10) Patent No.: US 7,684,014 B2
(45) Date of Patent: Mar. 23, 2010

(54) LITHOGRAPHIC APPARATUS AND DEVICE MANUFACTURING METHOD

(75) Inventors: Harry Sewell, Ridgefield, CT (US); Diane McCafferty, Sandy Hook, CT (US); Louis John Markoya, Sandy Hook, CT (US)

(73) Assignee: ASML Holding B.V., Veldhoven (NL)

( * ) Notice: Subject to any disclaimer, the term of this patent is extended or adjusted under 35 U.S.C. 154(b) by 707 days.

(21) Appl. No.: 11/607,100

(22) Filed: Dec. 1, 2006

(65) Prior Publication Data

US 2008/0129973 A1  Jun. 5, 2008

(51) Int. Cl.
- G03B 27/54 (2006.01)
- G03B 27/42 (2006.01)
- G03B 27/72 (2006.01)
- G03B 27/32 (2006.01)

(52) U.S. Cl. .............................. 355/67; 355/53; 355/71; 355/77

(58) Field of Classification Search ................... 355/53, 355/67, 71, 77; 430/312, 394; 359/558, 359/563
See application file for complete search history.

(56) References Cited

U.S. PATENT DOCUMENTS

| | | | |
|---|---|---|---|
| 5,640,239 A | 6/1997 | Takamiya et al. | |
| 5,715,089 A * | 2/1998 | Shiraishi | 359/558 |
| 5,771,098 A | 6/1998 | Ghosh et al. | |
| 6,178,000 B1 | 1/2001 | Hoffnagle | |
| 6,185,019 B1 | 2/2001 | Hobbs et al. | |
| 6,222,615 B1 * | 4/2001 | Suzuki | 355/68 |
| 6,304,318 B1 | 10/2001 | Matsumoto | |
| 6,556,280 B1 | 4/2003 | Kelsey et al. | |
| 6,830,850 B1 | 12/2004 | Krivokapic et al. | |
| 6,882,477 B1 | 4/2005 | Schattenburg et al. | |
| 7,561,252 B2 * | 7/2009 | Sewell et al. | 355/67 |
| 2001/0021487 A1 | 9/2001 | Williams et al. | |
| 2001/0035991 A1 | 11/2001 | Hobbs et al. | |
| 2002/0030802 A1 | 3/2002 | Sugita et al. | |
| 2002/0031725 A1 | 3/2002 | Sugita et al. | |
| 2002/0149757 A1 | 10/2002 | Kelsey et al. | |
| 2002/0149849 A1 | 10/2002 | Kelsey et al. | |

(Continued)

FOREIGN PATENT DOCUMENTS

JP  2000-021720 A  1/2000

(Continued)

OTHER PUBLICATIONS

Translation of JP 2000-021720 (dated Jan. 21, 2000).*

(Continued)

*Primary Examiner*—Alan A Mathews
(74) *Attorney, Agent, or Firm*—Pillsbury Winthrop Shaw Pittman LLP

(57) ABSTRACT

A lithographic apparatus is presented. The lithographic apparatus includes a beam splitter configured to split a radiation beam into a plurality of radiation beams; a substrate stage configured to support a substrate; a beam combiner adapted to redirect and combine at least a portion of the plurality of radiation beams to form an interference pattern on the substrate; and a control unit in communication with the substrate stage and a radiation source configured to output the beam of radiation, the control unit configured to synchronize a motion of the substrate stage with a repetition rate at which the beam of radiation is output by the radiation source.

20 Claims, 9 Drawing Sheets

U.S. PATENT DOCUMENTS

| | | |
|---|---|---|
| 2003/0098979 A1 | 5/2003 | Dress et al. |
| 2003/0147082 A1 | 8/2003 | Goldstein |
| 2004/0042724 A1 | 3/2004 | Gombert et al. |
| 2005/0012933 A1 | 1/2005 | Matthews |
| 2005/0057735 A1 | 3/2005 | Smith |
| 2005/0064297 A1 | 3/2005 | Wago |
| 2005/0073671 A1 | 4/2005 | Borodovsky |
| 2005/0074698 A1 | 4/2005 | Borodovsky |
| 2005/0088633 A1 | 4/2005 | Borodovsky |
| 2005/0105100 A1 | 5/2005 | Swindal |
| 2006/0044539 A1 | 3/2006 | Markoya et al. |
| 2006/0125913 A1* | 6/2006 | Sceats et al. ................ 347/248 |
| 2006/0170896 A1 | 8/2006 | Markoya et al. |
| 2006/0191884 A1* | 8/2006 | Johnson et al. ........ 219/121.85 |
| 2007/0263269 A1* | 11/2007 | Flagello ...................... 359/35 |

FOREIGN PATENT DOCUMENTS

| | | |
|---|---|---|
| JP | 2001-223149 A | 8/2001 |
| JP | 2004-317922 A | 11/2004 |
| JP | 2005-134873 A | 5/2005 |
| KR | 1994-0001227 B1 | 2/1994 |
| WO | 2004/003611 A1 | 1/2004 |
| WO | 2004/088363 A1 | 10/2004 |

OTHER PUBLICATIONS

U.S. Appl. No. 11/320,473, filed Dec. 29, 2005, Sewell et al.

* cited by examiner

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size of a feature arranged in an array with a 1:1 duty cycle (i.e., equal lines and spaces or holes with size equal to half the pitch). Thus, in the context of an array of features characterized by a certain pitch at which the features are spaced in the array, the critical dimension CD in equation (1) represents the value of half of a minimum pitch that can be printed, referred to hereinafter as the "half-pitch."

It follows from equation (1) that a reduction of the minimum printable size of features can be obtained in three ways: by shortening the exposure wavelength $\lambda$, by increasing the numerical aperture $NA_{PS}$ or by decreasing the value of $k_1$.

Current resolution enhancement techniques that have been extensively used in lithography to lower the Rayleigh constant $k_1$, thereby improving the pattern resolution, include the use of, for example, attenuated or alternating phase shift masks and/or sub-resolution assist features (SRAF) and/or off-axis illumination. These resolution enhancement techniques are of particular importance for lithographic printing and processing of contact holes or vias which define connections between wiring levels in an IC device, because contact holes have, compared to other IC features, a relatively small area. Contact holes may be printed, for example, using conventional on-axis illumination in combination with a phase shift mask and a positive resist.

However, the use of these resolution enhancement techniques may not be feasible to pattern small features and contact holes below about 85 nm (at $\lambda$=193 nm, $NA_{PS}$=0.93, and $k_1$=0.4). These techniques have limited capabilities and may not provide sufficient process latitude (i.e., the combined usable depth of focus and allowable variance of exposure dose for a given tolerance in the critical dimension) to print half-pitches below a CD obtainable when operating at $k_1$=0.4. The numerical aperture and $k_1$ factor values required to achieve a 32 nm line/space pattern with a 193 nm lithographic system is beyond the current lens technology.

SUMMARY

It is desirable to provide a lithographic apparatus configured to image small patterns with a high pattern width control and uniformity.

In an embodiment, there is provided a lithographic apparatus including a beam splitter configured to split a beam of radiation into a plurality of radiation beams; a substrate stage configured to support a substrate; a beam combiner adapted to redirect and combine at least a portion of the plurality of radiation beams to form an interference pattern on the substrate; and a control unit in communication with the substrate stage and a radiation source configured to output the beam of radiation, the control unit configured to synchronize a motion of the substrate stage with a repetition rate at which the beam of radiation is output by the radiation source.

In another embodiment of the invention, there is provided a lithographic apparatus including a diffraction grating configured to create a plurality of radiation beams when the diffraction grating is impinged by a beam of radiation; a substrate stage configured to support a substrate; a beam combiner adapted to redirect and combine at least a portion of the plurality of radiation beams to form an interference pattern on a surface of the substrate; and a control unit in communication with the substrate stage and a radiation source configured to output the beam of radiation, the control unit configured to synchronize a motion of the substrate stage with a repetition rate at which the beam of radiation is outputted by the radiation source such that the substrate stage moves over a whole number of pitches of the interference pattern between two consecutive beams of radiation output by the radiation source.

In yet another embodiment of the invention, there is provided a device manufacturing method including splitting a beam of radiation so as to form a plurality of radiation beams; redirecting and combining at least a portion of the plurality of radiation beams onto a substrate so as to form an interference pattern; and synchronizing a motion of a substrate table configured to support the substrate with a repetition rate at which the beam of radiation is output by a radiation source.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

A lithographic apparatus in accordance with an embodiment of the invention is configured to achieve high printing resolution and to provide high control and uniformity of the printed pattern. In an implementation, the lithographic apparatus is an interferometric lithographic apparatus that is configured to continuously move a substrate through a static, interferometrically produced image field to produce a scanned replication of the static field over the whole surface of the substrate.

Figure 1:
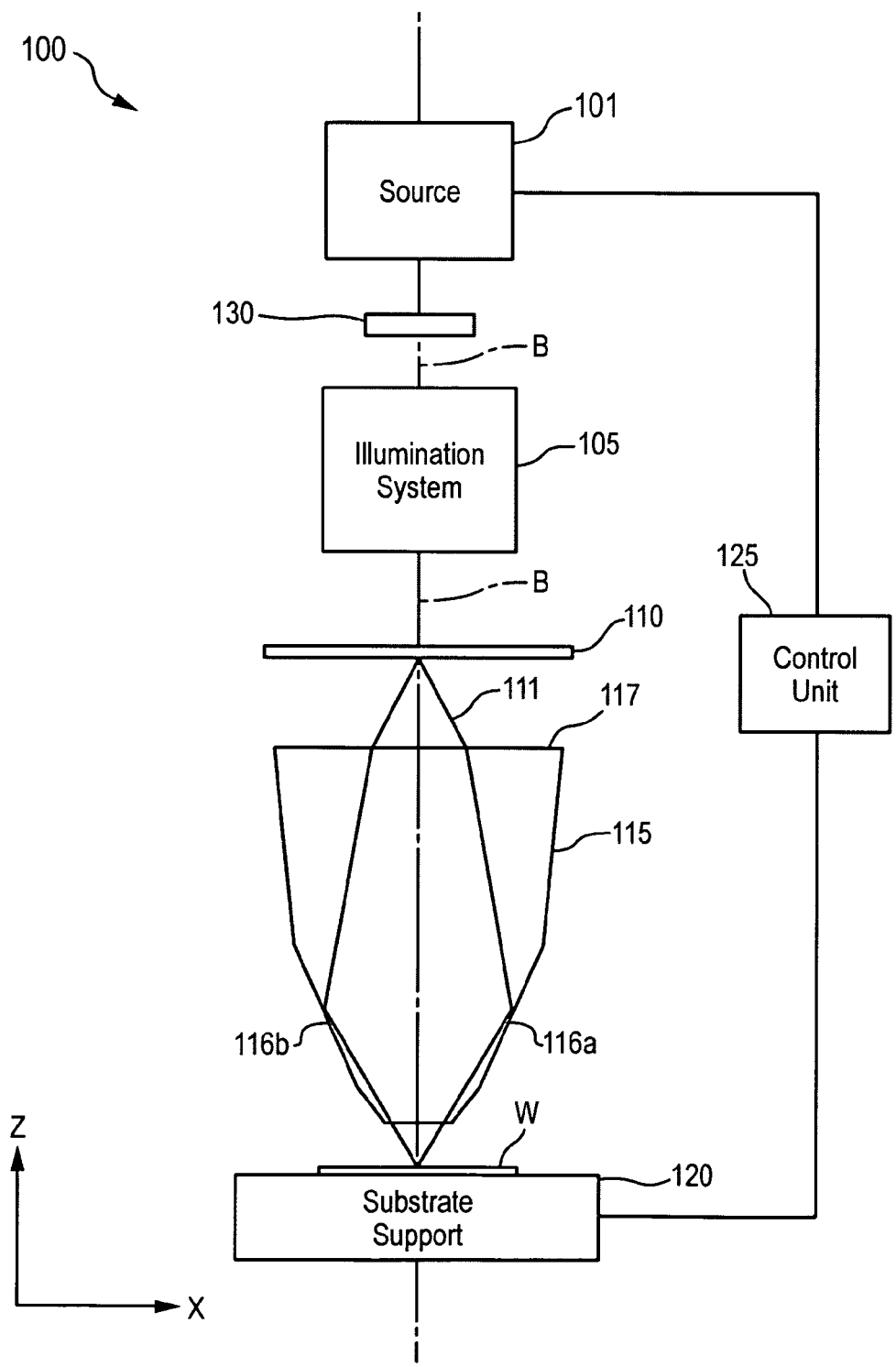
FIG. 1 schematically depicts a lithographic apparatus in accordance with an embodiment of the invention.

FIG. 1 shows a lithographic apparatus 100 in accordance with an embodiment of the invention. The apparatus 100 generally includes an illumination system (IL) 105 to condition a radiation beam B (e.g., UV radiation or DUV radiation), a beam splitter 110, a combiner 115 and a substrate support 120 configured to support a substrate W.

The illumination system 105 may include various types of optical components, such as refractive, reflective, magnetic, electromagnetic, electrostatic or other types of optical components, or any combination thereof, to direct, shape, or control radiation.

The substrate support 120 is configured to support the substrate W using mechanical, vacuum, electrostatic or other clamping techniques. The substrate support 120 may be a frame or a table, for example, which may be fixed or movable as required. The substrate support 120 may ensure that the substrate W is at a desired position, for example with respect to the combiner 115.

The illumination system 10S is adapted to receive a radiation beam B from a radiation source 101. The source 101 and the lithographic apparatus 100 may be separate entities. In such cases, the source 101 is not considered to form part of the lithographic apparatus 100 and the radiation beam B is passed from the source 101 to the illumination system 105 with the aid of a beam delivery system (not shown in FIG. 1) including, for example, suitable directing mirrors and/or a beam expander. In other cases, the source 101 may be an integral part of the lithographic apparatus 100. The source 101 and the illumination system 105, together with the beam delivery system, if required, may be referred to as a radiation system.

In the embodiment of FIG. 1, the radiation source 101 is configured to output the radiation beam B at a predetermined rate and for a predetermined radiation wavelength. The repetition rate at which the source emits/outputs the radiation beam B may also be referred to hereinafter as the pulse of the radiation source 101. For example, the radiation source 101 may be an excimer laser and the radiation wavelength may be 193 nm. Additional radiation sources having an adjustable radiation repetition rate (or radiation pulse) and/or radiation wavelengths may be used in other embodiments of the invention.

In an embodiment, the beam splitter 110 is a diffraction grating that generates diffraction order beams 111. The diffraction order beams 111 are spatially and temporally coherent beams. The beam splitter 110 is a one or two dimensional diffraction grating. An example of diffraction grating that can be used to form the interference pattern includes a glass plate with a checkerboard grating. The grating can be a phase shift mask grating or a binary grating. In various configurations, the beam splitter or grating 110 includes a glass plate with a chrome checkerboard pattern, an etched phase pattern, a chrome basket weave pattern or an etched weave pattern.

Referring back to FIG. 1, at least a portion of the plurality of beams 111 generated by the beam splitter 110 enters the combiner 115 and internally reflect off one of the surfaces (surfaces 116a-b in FIG. 1) of the combiner. The beams 111 then form the interference fringes on the substrate W.

In the lithographic apparatus 100 of FIG. 1, the plurality of beams 111 create an interference pattern at the upper surface of the substrate W. The interference pattern exposes a photoresist layer (not shown in FIG. 1), which forms a grating pattern. The interference pattern includes fringes of maximum intensity formed by constructive interference of the plurality of beams 111. The fringes are separated by zones of minimum intensity that are caused by destructive interference of the plurality of beams 111.

The pattern produced on the substrate W is a repetitive pattern. The details of the repetitive pattern unit depends upon the number of coherent radiation beams that are interfered. In the simplest form, two diffractions beams interfere to produce lines and spaces. In this configuration, diffraction beams corresponding to the plus and minus first diffraction orders (+1X and −1X or +1Y and −1Y) in one direction (e.g., X or Y) are collected and interfered on the substrate W. Using three or four radiation beams produces arrays of contact windows or resist pillars. In this configuration, beams corresponding to the plus and minus first diffraction orders in two directions (+1X, −1X, +1Y and −1Y) are collected and interfered on the substrate W. The actual angles of the diffraction beams set up the pitch in the particular beam direction. Using six diffraction beams gives hexagonal type pattern layouts. Using eight diffraction beams gives octagonal type pattern layouts. Generally, any patterning device pattern may be emulated by passing the radiation beam B through the beam splitter 110 and collecting all of the diffraction beams 111 and recombining them to produce the interference pattern.

The combiner 115 of FIG. 1 is a multi-faceted prism. A benefit of using a prism such as shown in FIG. 1 is that there are no alignment difficulties once the prism is manufactured. In FIG. 1, the beam combiner 115 is adapted to redirect at least a portion of the plurality of beams 111 generated by the beam splitter 110. In an embodiment, the beam combiner 115 is adapted to redirect substantially all of the plurality of beams 111 generated by the beam splitter 110.

Figure 2:
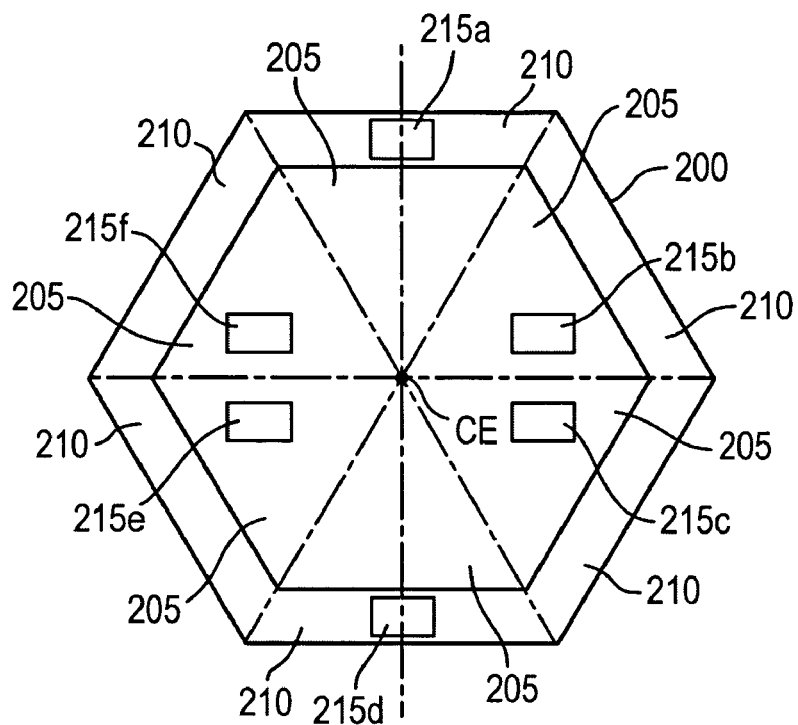
FIGS. 2 and 3 show, respectively, end views of a hexagonal beam combiner and a square beam combiner in accordance with an embodiment of the invention.
Figure 3:
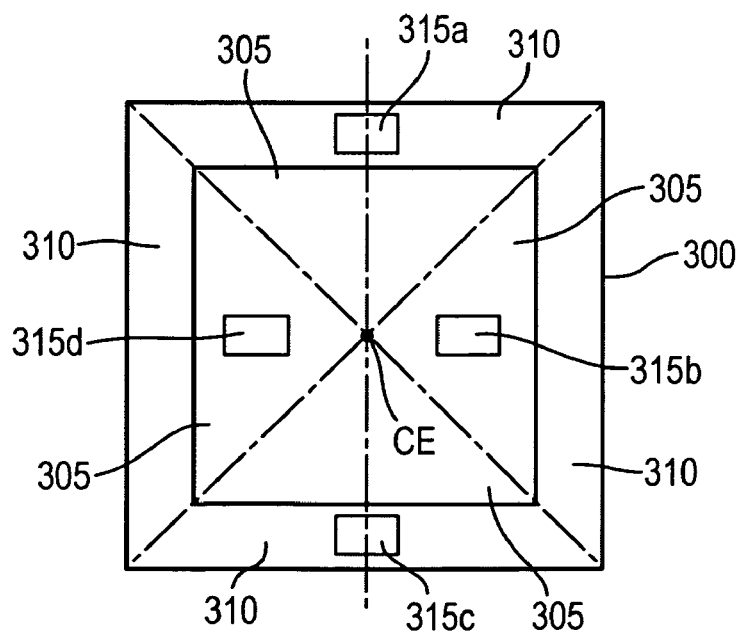

The prism of FIG. 1 may be generalized to have N-way symmetry. For example, in one configuration, the prism may have a six-way symmetry (hexagonal prism), as shown in FIG. 2. This figure shows an end view of a hexagonal prism in accordance with an embodiment of the invention. The prism 200 includes six high angle zones 205 and six low angle zones 210 that are distributed around the center CE of the prism. In FIG. 2, the prism 200 is adapted to combine six beams 215a-f in order to form the interference fringes at the surface of the substrate W. The hexagonal prism 200 may be used to create a DRAM type structure. Alternatively, the multi-faceted combiner 115 could have four way symmetry (square prism), as shown in FIG. 3. The square prism 300 of FIG. 3 includes four high angle zones 305 and four low angle zones 310 that are distributed around the center CE. In FIG. 3, the prism 300 is adapted to combine four beams 315a-d. It will be appreciated that the design of the prism is not limited to that shown in FIGS. 2 and 3 and that the number N need not be an even number. For example, three way or five way symmetry could also be used in other embodiments of the invention. In one configuration, the beam combiner 115 of FIG. 1 is adapted to combine between about 2 to 8 beams in order to form the interference pattern.

In the embodiment shown in FIG. 2, beams 215a,d and beams 215b,c,f,e are reflected off by different angle zones of the hexagonal prism 200. Similarly, in the embodiment of FIG. 3, beams 315a-c and beams 315b-d are reflected off by different angle zones of the square prism 300. However, it will be appreciated that the beams shown in FIGS. 2-3 may be reflected off by the same angle zone in other embodiments of the invention. For example, beams 215a-d could be reflected off by angle zone 205 and beams 315a-c could be reflected off by angle zone 305.

The typical dimension of the combiner 115 is approximately less than 50 cm at the top face 117 (see FIG. 1). In one embodiment, the diameter of the top face 117 of the combiner 115 may be in the range from about 20 to 30 cm.

It will be appreciated that the combiner 115 is not limited to a multi-faceted prism as shown in FIG. 1. For example, in the embodiment shown in FIG. 1, the lithographic apparatus 100 may include a combiner that includes a curved lower surface adapted to reflect off the plurality of diffraction beams 111. In another embodiment of the invention, the combiner 115 consists of a plurality of mirrors that are independently moveable to redirect the plurality of diffraction beams 111 toward the surface of the substrate W. In this latter embodiment, the orientation of the mirrors may be controlled with a controller.

The prism or the orientation of the plurality of mirrors is selected based on the pattern geometry. In an embodiment, a simulation program is used to select the geometry of the beam splitter that produces the desired pattern. The simulation program produces a pupil map of the diffraction beams 111 generated by the beam splitter 110, which pupil map represents the radiation beams' positions. Based on the radiation beams' position in the pupil map, the orientations of the mirrors or the inclinations of the sides of the prism are selected to capture all or some of the diffraction beams 111.

Referring back to FIG. 1, the lithographic apparatus 100 includes a control unit 125 that is adapted to synchronize the motion of the substrate stage 120 with the radiation pulsing of the radiation source 101. The control unit 125 is in communication with the radiation source 101 and the substrate table 120. Synchronization of the motion of the substrate stage 120 with the radiation pulsing of the radiation source 101 can be achieved by triggering the selected section of the longer raw radiation pulse.

Specifically, each time the radiation source 101 outputs/emits a radiation beam B (i.e., for each radiation pulse of the source 101), a plurality of diffraction beams 111 are produced by the beam splitter 110. At least some of the plurality of diffraction beams 111 are collected to print a static interference pattern on the substrate W. Between two consecutive emissions of the radiation beam B, the control unit 125 is adapted to move the substrate a whole number (i.e., an integer) of pattern pitches in the direction of movement of the substrate table 120 so that the interference pattern produced by a subsequent radiation pulse is substantially perfectly superimposed on the previous interference pattern. The synchronized motion of the substrate table 120 and the radiation pulsing of the radiation source 101 continues through the whole illumination slit width. With such process, continuous, scanned, long stripes of imaging with two dimensional patterning can be produced which may be limited only by the substrate scan length and slit height.

The synchronous motion of the substrate table 120 and the radiation pulsing of the source 101 has the effect of image averaging in a dynamic action. As images from different parts of the imaging field are superimposed, any optical device based aberrations over the field can be equalized. Images from different parts of the optical train are averaged together. These provide pattern width control and uniformity.

Figure 4:
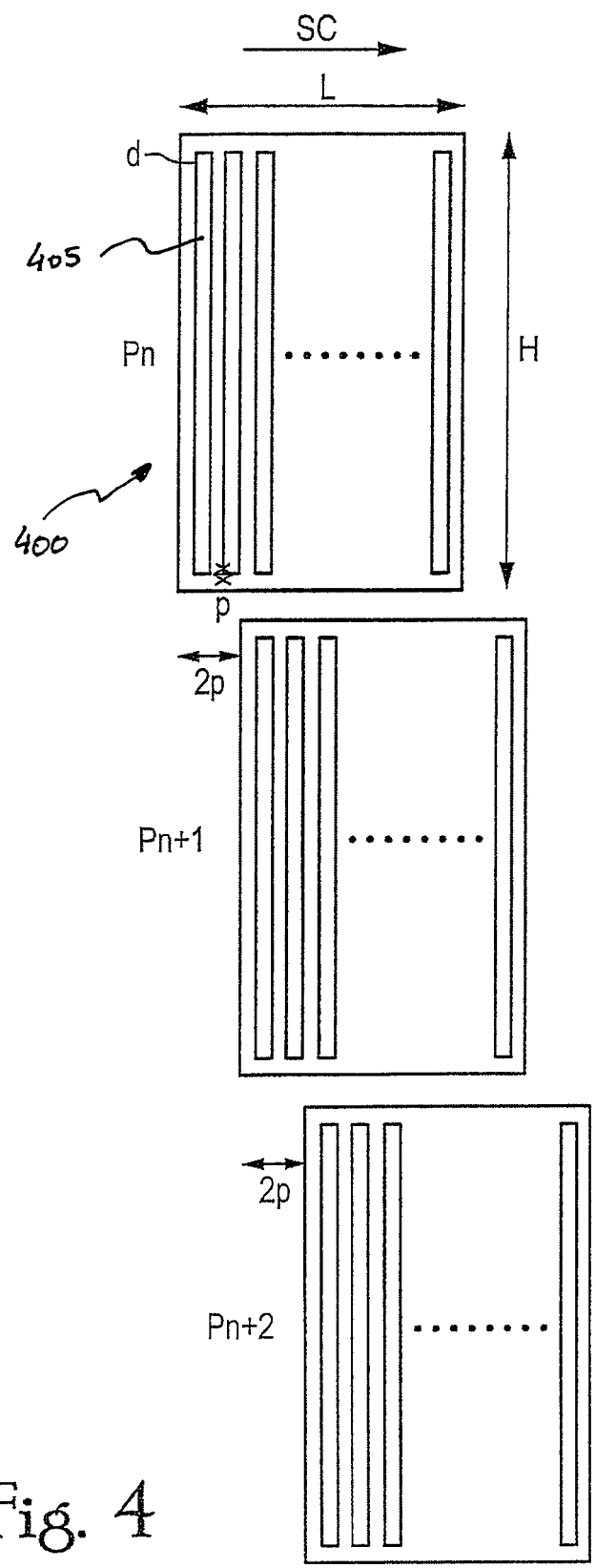
FIG. 4 shows an interference pattern defined on the substrate during the synchronized motion of the substrate stage and the radiation pulsing of the source of the lithographic apparatus shown in FIG. 1.

Referring now to FIG. 4, this figure shows the interference pattern defined on the substrate W during the synchronized motion of the substrate stage 120 and the radiation pulsing of the source 101. The pattern 400 exposed in FIG. 4 is a repetitive pattern of lines 405 having a width d arranged in a pitch p. This pattern of lines can be considered a one dimensional pattern since the length of the lines is much larger than their width. In FIG. 4, the distance separating two adjacent lines corresponds to half of the pitch p. It will be appreciated that additional repetitive patterns and/or pitches could be used in other embodiments of the invention. For example, in one implementation, a two dimensional repetitive pattern (e.g., rectangles, or short straps) or a repetitive pattern of holes could be created on the substrate W.

FIG. 4 shows the exposure field corresponding to three consecutive radiation pulses (Pn, Pn+1, and Pn+2). The exposure field is defined by its length L and its height H. In one implementation, a typical exposure field is about 5 mm (L) by 26 mm (H). In FIG. 4, only four lines in the exposure field are represented. However, it will be appreciated that, depending on the pitch and pattern size, millions of pattern features are exposed during each radiation pulse. It will also be appreciated that the exposure field size may be different in other implementations.

During each radiation pulse and between two consecutive radiation pulses, the substrate table 120 moves continuously along a scan direction (SC), which direction is substantially parallel to the length L of the exposure field. The control unit 125 controls the speed of the substrate table 120 so that the lines of the pattern exposed during the subsequent radiation Pn+1 are superimposed on the previous exposed pattern lines Pn. For example, in the embodiment of FIG. 4, the speed of the substrate table 120 is such that the substrate W is moved over a distance that corresponds to a number of pitches 2p between radiation pulses Pn and Pn+1 and radiation pulses Pn+1 and Pn+2.

It will be appreciated that the speed of the substrate table 120 and the radiation pulse or repetition rate of the source 101 can be adjusted differently in other embodiments of the invention. In addition, the whole number of pattern pitches could be different in other embodiments of the invention. The whole number of pattern pitches used depends on the radiation pulse or repetition rate of the source 101, the radiation energy, the speed of the substrate table 120 that is desired to deliver the desired exposure dose for the type of resist being used and the pattern repeat distance (i.e., the pattern pitch). For example, the exposure process may be configured such that each pattern unit or line receives about 50 flashes per 5 mm of scan, which scan length corresponds to the length L of the exposure field. If the pitch p is set to about 50 nm, the substrate table speed and the radiation pulse rate may be adjusted such that the substrate moves over about 100 μm between two radiation pulses. To carry out this process, the speed of the substrate table 120 is then set to about 300 mm/s and the radiation pulse rate of the source is set to about 3000 Hz. Depending on the type of source used (e.g., excimer laser or other types of laser sources), repetition rates can be adjusted between 100 Hz and 10,000 Hz. In an embodiment, the radiation pulse or repetition rate is in a range between 1,000 Hz and 6,000 Hz.

The control unit 125 is configured to continuously move the substrate W. As such, the width or duration of the radiation pulse may affect the pattern width control and uniformity. If the radiation pulse width is too long, image blurring in the scan direction SC may occur. For example, if the speed of the substrate stage 120 is about 300 nm/s and the radiation pulse width or duration is 10 ns, the substrate stage 120 only moves over a distance of about 3 nm during the radiation pulse width. Therefore, the image blur in the direction of the motion of the substrate stage 120 is less than about 3 nm. If smaller blur values are desired, shorter radiation pulse widths or durations may be used. Alternatively, optics 130 may be used to select a synchronized part of the radiation pulse width, e.g., 2 ns out of the 10 ns radiation pulse width. If a 2 ns radiation pulse width is selected, then the image blur in the scan direction SC is reduced to about 0.6 nm.

Figure 10A:
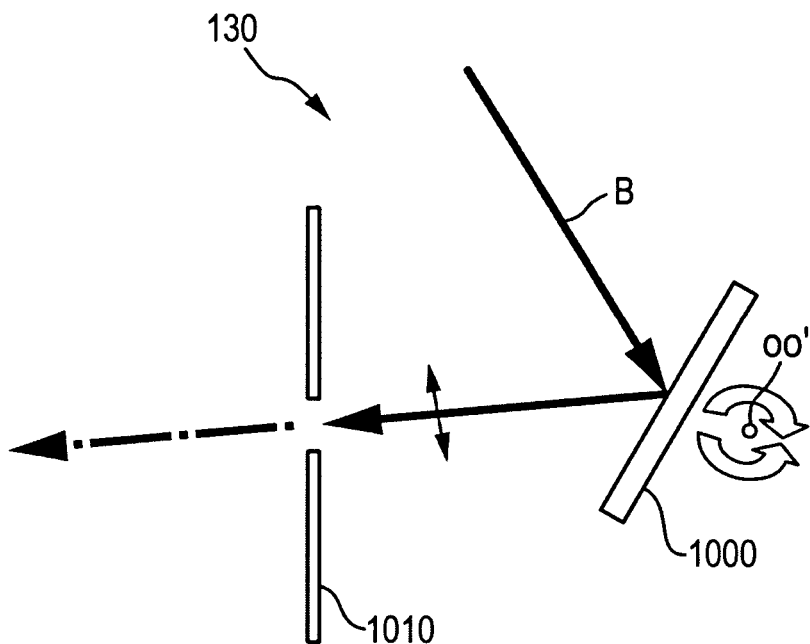
FIGS. 10a-b show two optical arrangements configured to select a synchronized part of the radiation pulse width in accordance with different embodiments of the invention.
Figure 10B:
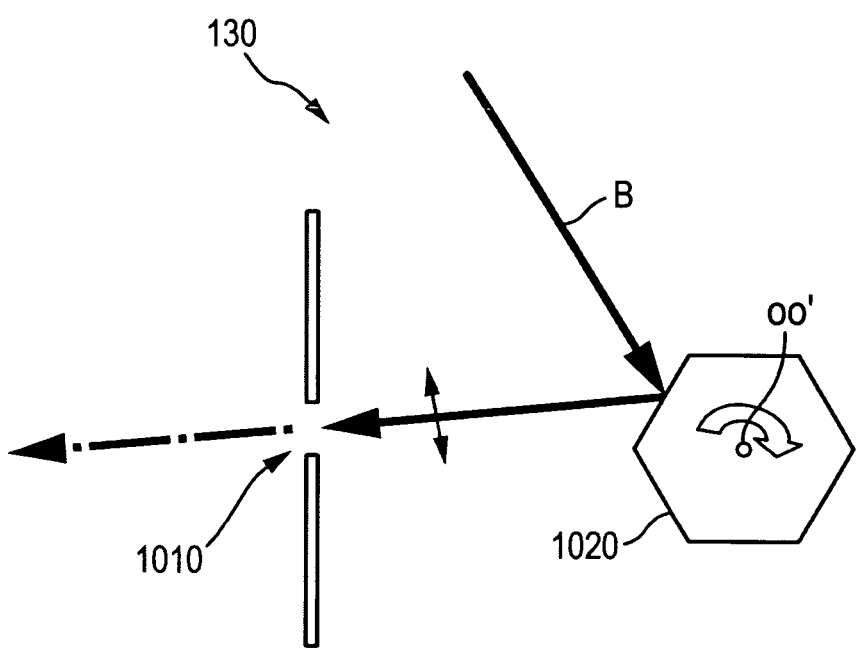

FIGS. 10a-b show two schematic representations of optics 130 in accordance with different embodiments of the invention. Optics 130 are configured to select out part of a stretched radiation beam pulse B in order to shorten the radiation beam pulse width. In FIG. 10a, optics 130 include a rotating mirror 1000 and a beam aperture 1010. Rotating mirror 1000 oscillates about an axis V, which is perpendicular to the plane of FIG. 10a. Oscillation of the mirror 1000 is synchronized with the radiation beam pulse repartition rate of the radiation source 101. In operation, the radiation beam B is reflected by rotating mirror 1000 toward the beam aperture 1010. Rotation of the mirror 1000 scans the reflected radiation beam B around the beam aperture 1010 so that only part of a stretched radiation beam pulse B is allowed to pass through the beam aperture 1010. In that way, a selected stage synchronized radiation beam pulse may be produced. FIG. 10b shows an alternative arrangement of optics 130. In FIG. 10b, optics 130 include a rotating multi-faceted element 1020 and a beam aperture 1010. Similarly to FIG. 10a, rotation of the multi-faceted element 1020 is synchronized with the repartition rate of the radiation source 101. The radiation beam B is reflected by the rotating multi-faceted element 1020. Rotation of the multi-faceted element 1020 scans the reflected radiation beam B around the beam aperture 1010 so that only part of a stretched radiation beam pulse B is allowed to pass through the beam aperture 1010.

The synchronization of the repetition rate of the source 101 with the scanning of the substrate stage 120 is carried out such that each pattern unit receives substantially the same total dose or energy. It follows that the pattern units positioned at the front end of the first exposure field and the back end of the last exposure field will receive less dose or energy. For example, with reference to FIG. 4, since the pattern exposure is repeated every two pitches, or 100 nm, and each line receives 50 flashes, the first 100 lines printed on the substrate W receive less than 50 flashes. Thus, to ensure that each line or pattern receives the same total dose or energy, the control unit 125 is adapted to begin the scanning action outside the desired location on the substrate W where the repetitive pattern should be produced. The scanning distance over which each pattern receives less than the desired total dose may be referred to hereinafter as the preparation distance.

Figure 5:
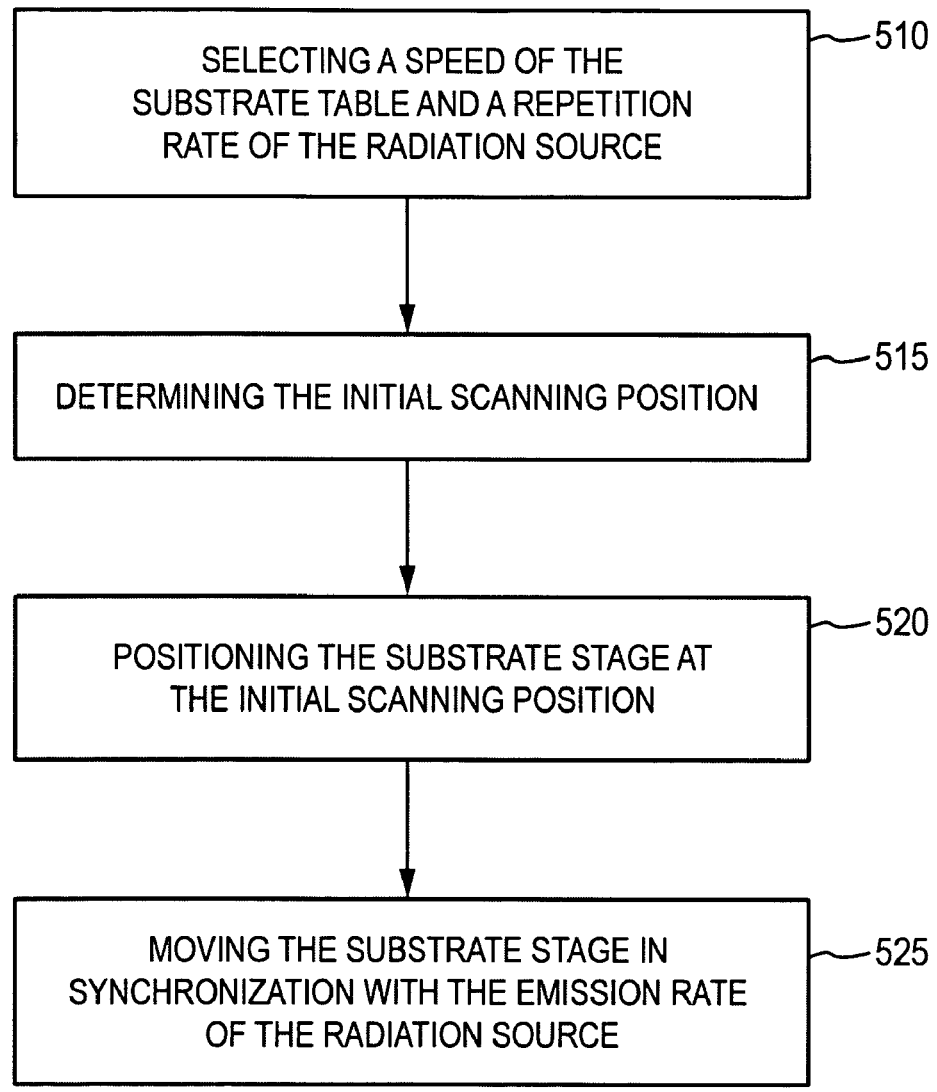
FIG. 5 shows a method for printing a pattern onto a substrate in accordance with an embodiment of the invention.

Referring to FIG. 5, this figure shows a method for printing a pattern onto a substrate in accordance with an embodiment of the invention. The method begins at block 510 where a speed of the substrate table 120 and the radiation pulse or repetition rate of the source 101 are selected such that the interference pattern produced by a subsequent radiation pulse is substantially perfectly superimposed on the previous interference pattern. Selection of the speed of the substrate stage 120 and the radiation pulse or repetition rate is based upon the type of resist, the number of radiation pulses needed to develop each pattern unit, the pitch p of the pattern and the energy of the radiation beam of each pulse. The method then proceeds to block 515 where the initial scanning position is determined. To this effect, the preparation distance over which each pattern receives less than the desired total dose is determined. This distance is calculated based on the speed of the substrate stage, the laser repetition rate and the pitch of the pattern. After determining the preparation distance, the method then proceeds to block 520 where the substrate stage 120 positions the substrate W at an initial scanning position. The preparation distance separates the initial scanning position from the desired position of the pattern on the substrate W. If the pattern is printed proximate an edge of the substrate W, the initial position may be located outside the substrate W. Next, the method ends at block 525 where the substrate table 120 is moved along the scanning direction in synchronization with the radiation pulse or emission rate of the source 101.

In an embodiment, a pattern resolution or half-pitches of about 35 to 40 nm (corresponding to a minimum pitch of about 70-80 nm) can be obtained with the method of FIG. 5.

Figure 6:
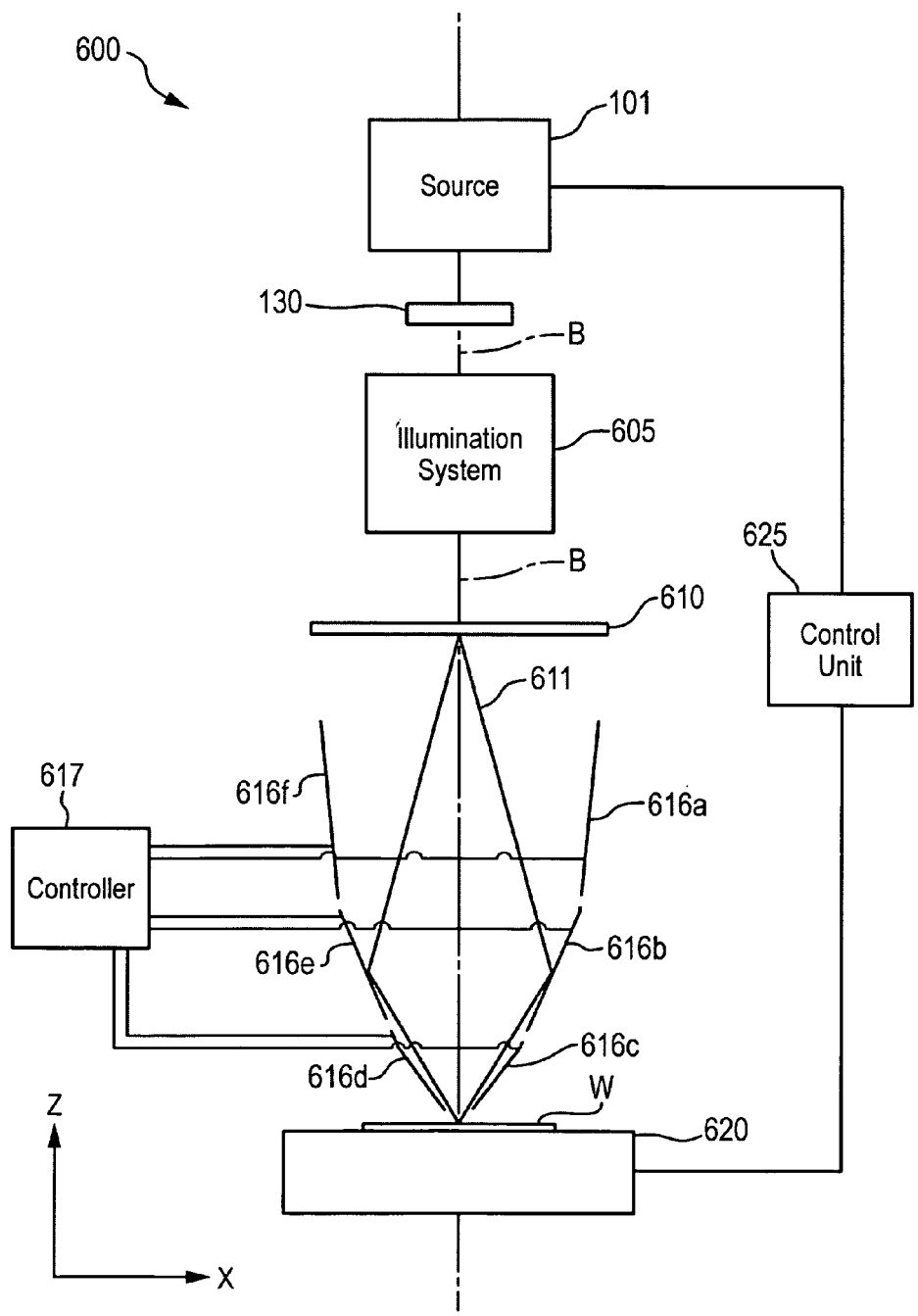
FIG. 6 schematically depicts a lithographic apparatus in accordance with an embodiment of the invention.

FIG. 6 shows a lithographic apparatus 600 in accordance with an embodiment of the invention. Similarly to the embodiment of FIG. 1, the lithographic apparatus 600 includes a first beam splitter 610, a radiation transfer device or illumination system 605, a beam splitter 610, and a beam combiner 615. The beam combiner 615 includes a plurality of mirrors 616a-f that are independently moveable to redirect the plurality of beams 611 toward the surface of the substrate W. The substrate W is supported by a substrate stage 120. The orientation of the mirror 616a-f may be controlled with a controller 617. Similarly to the apparatus of FIG. 1, a control unit 625 is adapted to synchronize the motion of the substrate stage 620 with a repetition rate of the radiation source 101. It will be appreciated that additional mirrors or fewer mirrors could be used in other embodiments of the invention.

Figure 7:
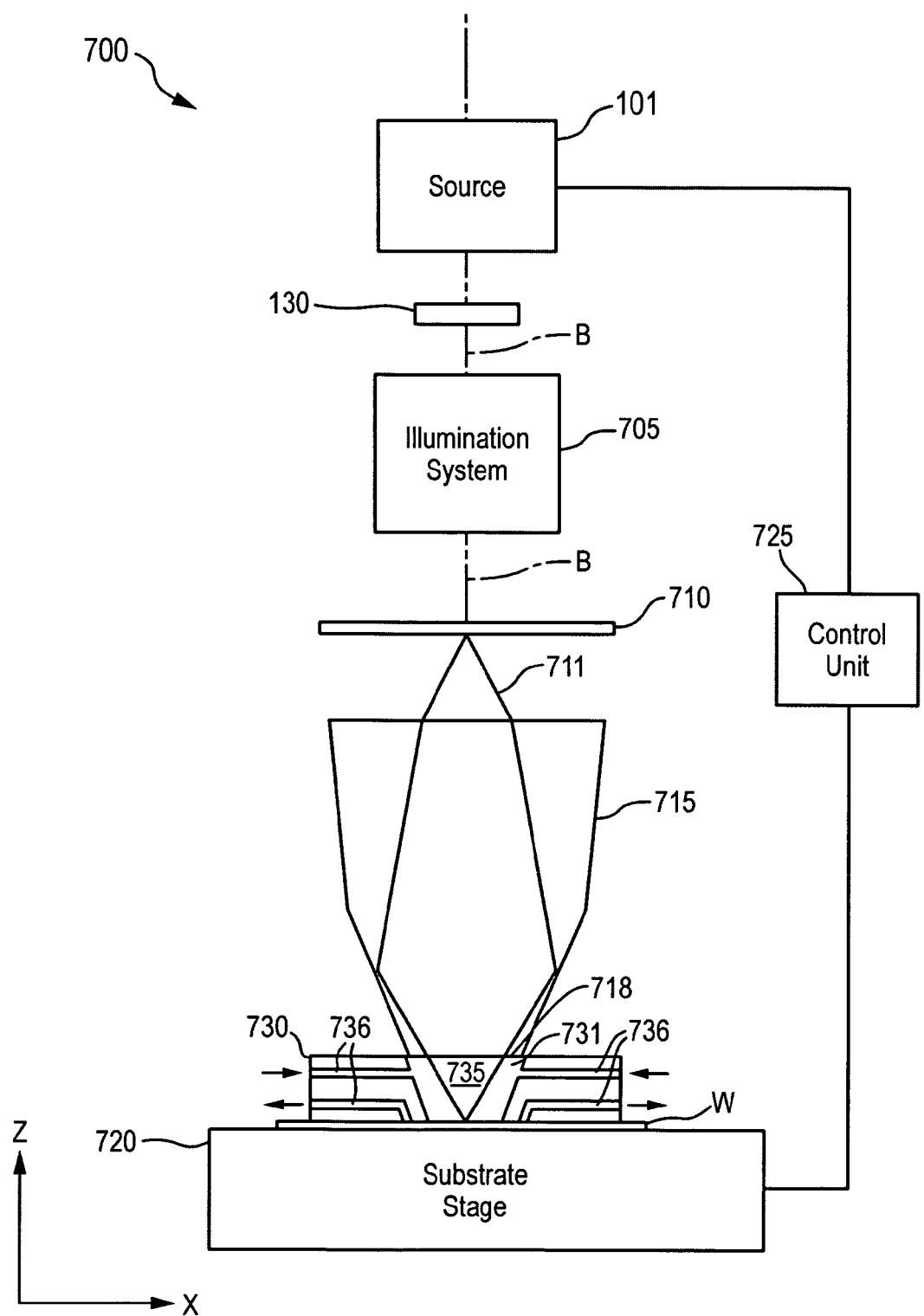
FIG. 7 schematically depicts a lithographic apparatus in accordance with an embodiment of the invention.

In an embodiment, the lithographic apparatus may be used in conjunction with an immersion liquid system. A lithographic apparatus in accordance with this embodiment is shown in FIG. 7. Similarly to FIG. 6, the lithographic apparatus 700 includes a radiation transfer device or illumination system 705, a grating 710, and a beam combiner 715. The lithographic apparatus 700 also includes a liquid supply system 730 arranged between the beam combiner 715 and the substrate W, which is positioned on the substrate stage WT. The liquid supply system 720 includes a reservoir 731 that is filled with liquid 735 having a relatively high refractive index, e.g., water, provided via inlet/outlet ducts 736. Since the radiation wavelength of the impinging radiation beam B is shorter in liquid than in the air or in a vacuum, smaller features can be resolved. In an embodiment, liquid 735 of the liquid supply system 730 may be in contact with the bottom face 718 of the beam combiner 715. Similarly to the apparatus of FIG. 1, a control unit 725 is adapted to synchronize the motion of the substrate stage 720 with a repetition rate of the radiation source 101.

Figure 8:
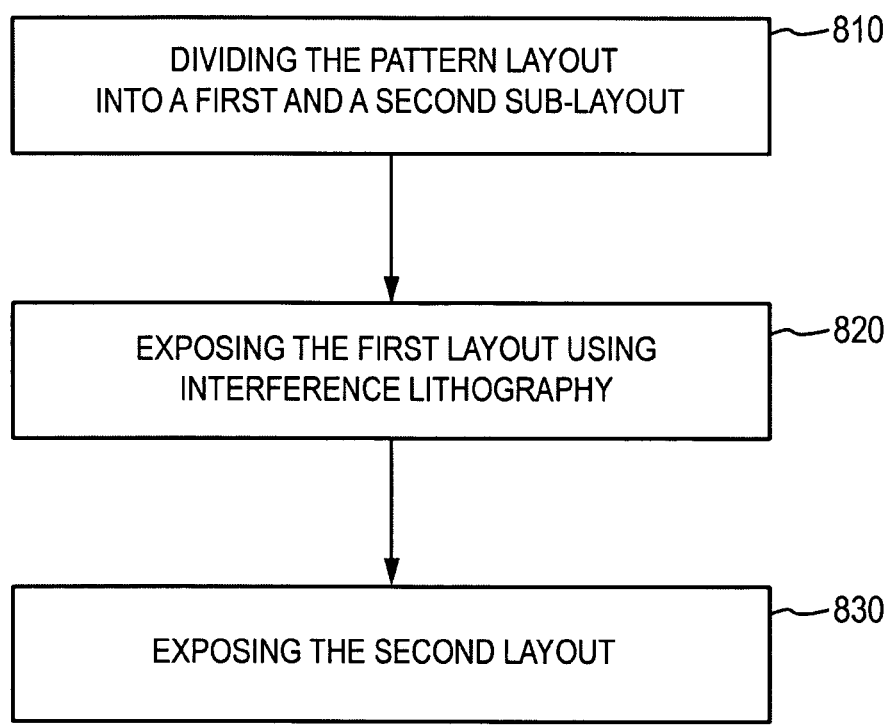
FIG. 8 shows a method for printing a pattern in accordance with an embodiment of the invention.

In an embodiment of the invention, a multiple exposure process could be used to print a desired pattern. Referring to FIG. 8, this figure shows a method for printing a desired pattern in accordance with an embodiment of the invention. The method starts at block 810 where the layout of the pattern is divided into a first and a second sub-layout. The division of the layout is done such that the first sub-layout includes a periodic pattern and the second layout includes (a) a non periodic pattern, (b) a pattern that is different from that included in the first sub layout and/or (c) a pattern that is generally included in the periphery of the layout. The method then proceeds to block 820 where a first exposure using interference lithography is carried out to image the first sub-layout on the substrate. The first exposure is carried out in accordance with the method of FIG. 5. The first exposure could be done using one of the lithographic apparatuses shown in FIGS. 1 and 6-7. After exposing the first sub-layout, the method proceeds to block 830 where the second sub-layout is transferred. With the method of FIG. 8, a critical periodic pattern can be printed via interference lithography.

Thus, in the process of FIG. 8, the exposure of the first sub-layout is performed using interference lithography and the exposure of the second sub-layout is performed without interference lithography.

It will be appreciated that the order of the first exposure and the transfer of the second sub-layout could be reversed in another embodiment of the invention. In addition, it will be appreciated that the layout of the patterning device could be divided into more than two layouts. For example, in one configuration, a first sub-layout could include a first periodic pattern and a second sub-layout could include a second periodic pattern (different from the first one). In this configuration, more than three exposures or transfers can be used to image or transfer the first, second and third sub-layouts.

Figure 9:
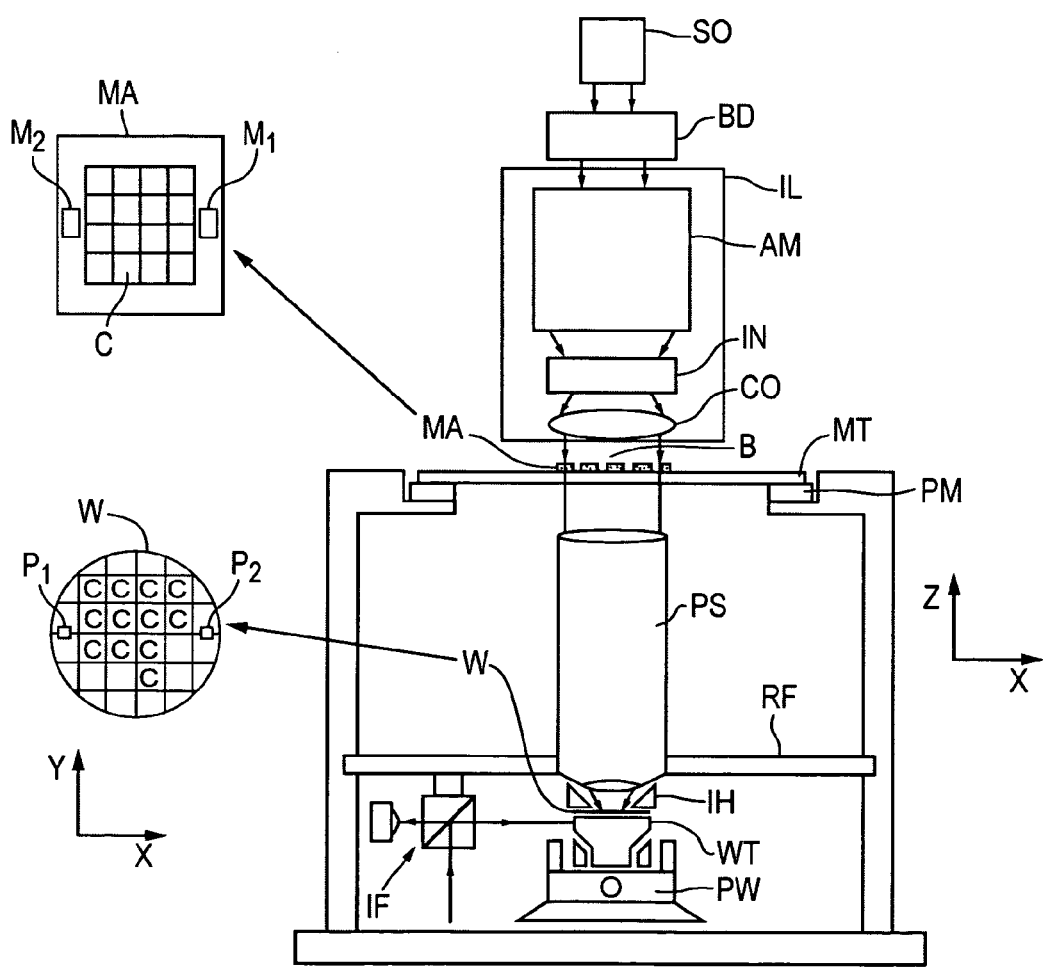
FIG. 9 schematically depicts a lithographic apparatus in accordance with an embodiment of the invention.

The transfer of the second sub-layout 830 of FIG. 8 may be carried out with a mask-less lithographic apparatus, with a lithographic apparatus such as the one shown in FIG. 9, or an imprint apparatus.

For example, FIG. 9 schematically depicts a lithographic apparatus according to one embodiment of the invention that could be used to print the second sub-layout. The apparatus includes an illumination system (illuminator) IL configured to condition a radiation beam B (e.g., UV radiation or DUV radiation); a support structure (e.g., a mask table) MT constructed to hold a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more support structures). In such "multiple stage" machines the additional tables/support structures may be used in parallel, or preparatory steps may be carried out on one or more tables/support structure while one or more other tables/support structures are being used for exposure.

Referring to FIG. 9, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 9) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations of the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A lithographic apparatus comprising:
   a beam splitter configured to split a radiation beam into a plurality of radiation beams;
   a substrate stage configured to support a substrate;
   a beam combiner adapted to redirect and combine at least a portion of the plurality of radiation beams to form an interference pattern on the substrate; and
   a control unit in communication with the substrate stage and a radiation source configured to output the beam of radiation, the control unit configured to synchronize a motion of the substrate stage with a repetition rate at which the beam of radiation is output by the radiation source such that the substrate stage moves over an integral number of pitches of the interference pattern between two consecutive beams of radiation outputted by the radiation source.

2. The apparatus of claim 1, wherein the beam splitter is a diffraction grating.

3. The apparatus of claim 2, wherein the diffraction grating is an alternating phase shift grating or a binary grating.

4. The apparatus of claim 2, wherein the diffraction grating is a one dimensional or a two dimensional grating.

5. The apparatus of claim 1, wherein the beam combiner includes a multi-faceted prism.

6. The apparatus of claim 1, wherein the portion of the plurality of radiation beams includes between 2 and 8 beams.

7. The apparatus of claim 1, further comprising a liquid supply system arranged to provide liquid between a surface of the beam combiner and the surface of the substrate.

8. The apparatus of claim 1, wherein the beam combiner includes a plurality of independently moveable mirrors.

9. The apparatus of claim 1, wherein the repetition rate of the radiation source is in a range between 100 Hz and 10,000 Hz.

10. The apparatus of claim 1, wherein the control unit is configured to synchronize the motion of the substrate stage with a repetition rate of the radiation source such that a blur produced on the interference pattern is less than about 3 nm.

11. The apparatus of claim 1, wherein the radiation source is a laser.

12. The apparatus of claim 1, further comprising an optical device configured to select out part of a pulse width of the beam of radiation.

13. A lithographic apparatus comprising:
   a beam splitter configured to split a radiation beam into a plurality of radiation beams;
   a substrate stage configured to support a substrate;
   a beam combiner adapted to redirect and combine at least a portion of the plurality of radiation beams to form an interference pattern on the substrate; and
   a control unit in communication with the substrate stage and a radiation source configured to output the beam of radiation, the control unit configured to synchronize a motion of the substrate stage with a repetition rate at which the beam of radiation is output by the radiation source, wherein the control unit is configured to synchronize the motion of the substrate stage with the repetition rate of the radiation source such that the interference patterns produced by two consecutive beams of radiation are substantially superimposed.

14. A lithographic apparatus comprising:
   a diffraction grating configured to create a plurality of radiation beams when the diffraction grating is impinged by a beam of radiation;
   a substrate stage configured to support a substrate;
   a beam combiner adapted to redirect and combine at least a portion of the plurality of radiation beams to form an interference pattern on a surface of the substrate; and
   a control unit in communication with the substrate stage and a radiation source configured to output the beam of radiation, the control unit configured to synchronize a motion of the substrate stage with a repetition rate at which the beam of radiation is outputted by the radiation source such that the substrate stage moves over an integral number of pitches of the interference pattern between two consecutive beams of radiation output by the radiation source.

15. A device manufacturing method comprising:
   splitting a beam of radiation so as to form a plurality of radiation beams;
   redirecting and combining at least a portion of the plurality of radiation beams onto a substrate so as to form an interference pattern; and
   synchronizing a motion of a substrate table configured to support the substrate with a repetition rate at which the beam of radiation is output by a radiation source,
   wherein the synchronizing includes synchronizing the motion of the substrate stage with the repetition rate of the radiation source such that the substrate stage moves over an integral number of pitches of the interference pattern between two consecutive beams of radiation outputted by the radiation source.

16. The method of claim 15, further comprising selecting out part of a pulse width of the beam of radiation.

17. A device manufacturing method comprising:
   splitting a beam of radiation so as to form a plurality of radiation beams;
   redirecting and combining at least a portion of the plurality of radiation beams onto a substrate so as to form an interference pattern; and
   synchronizing a motion of a substrate table configured to support the substrate with a repetition rate at which the beam of radiation is output by a radiation source,
   wherein the synchronizing includes synchronizing the motion of the substrate stage with the repetition rate of the radiation source such that the interference patterns produced by two consecutive beams of radiation are substantially superimposed.

18. The method of claim 15, wherein the beam splitter is an alternating phase shift grating or a binary grating.

19. The method of claim 18, wherein the diffraction grating is a one dimensional or a two dimensional grating.

20. The method of claim 18, wherein the portion of the plurality of radiation beams includes between 2 and 8 beams.

* * * * *